United States Patent
Lin et al.

[11] Patent Number: 6,025,274
[45] Date of Patent: Feb. 15, 2000

[54] METHOD OF FABRICATING SALICIDE

[75] Inventors: Tony Lin, Kaohsiung Hsien; Jih-Wen Chou, Hsinchu, both of Taiwan

[73] Assignee: United Microelectronics Corp., Hsinchu, Taiwan

[21] Appl. No.: 09/227,950

[22] Filed: Jan. 11, 1999

[51] Int. Cl.[7] .......................... H01L 21/00; H01L 21/336
[52] U.S. Cl. ........................ 438/721; 438/722; 438/734
[58] Field of Search ................................. 438/721, 722, 438/734

[56] References Cited

U.S. PATENT DOCUMENTS

| | | | |
|---|---|---|---|
| 5,612,239 | 3/1997 | Lin et al. | 437/44 |
| 5,776,835 | 7/1998 | Yeh et al. | 438/712 |
| 5,915,204 | 6/1999 | Sumi | 438/683 |
| 5,953,612 | 9/1999 | Lin et al. | 438/299 |

*Primary Examiner*—Benjamin L. Utech
*Assistant Examiner*—Charlotte A. Brown
*Attorney, Agent, or Firm*—Jiawei Huang; J.C. Patents

[57] ABSTRACT

A method fabricating salicide. A substrate having a polysilicon gate and a source/drain region is provided. A silicon oxide layer is formed on the polysilicon gate and the substrate. Using dry etch, a part of the silicon oxide layer is removed to leave a spacer with a waistline on a side wall of the polysilicon gate. A metal layer is formed on the polysilicon gate and the source/drain region. A rapid thermal process is performed to form a metal silicide

17 Claims, 3 Drawing Sheets

METHOD OF FABRICATING SALICIDE

BACKGROUND OF THE INVENTION

1. Field of the Invention

The invention relates in general to a method of fabricating a self-aligned silicide (salicide), and more particularly, to a method of fabricating a spacer without causing bridging effect between salicide.

2. Description of the Related Art

Due to the higher and higher device integration of semiconductors, the linewidth and patterned of devices are formed smaller and smaller. The shrinkage of the linewidth causes the resistance of a polysilicon gate (poly-gate) of a metal-oxide semiconductor (MOS) and the conductive wires of a device or a circuit increases greatly. An RC-delay is thus induced. To adjust the resistance, methods such as the formation of a salicide has been widely applied in VLSI or ULSI circuit. In the convention method of forming a salicide layer one or more than one metal layer is formed on a silicon surface. By performing a thermal process, the metal layer reacts with the silicon to form a silicide layer. Or alternatively, a silicide layer is formed to cover a silicon surface directly. The metal silicide has a better conductivity than silicon. Therefore, an improved electric operation is obtained for the poly-gate and the conductive wires formed by the conductive layer comprising silicon and metal silicide.

FIG. 1A and FIG. 1B are cross sectional views showing a conventional method for fabricating a salicide laver on a silicon or polysilicon surface to reduce the device resistance.

In FIG. 1A, a substrate 10 having a MOS device is provided. The MOS device comprises a source/drain region 19 in the substrate and a gate 12 on the substrate 10. The gate 12 and the substrate 10 are isolated with each other by a gate oxide layer 11. The gate 12 further comprises a side wall covered by a spacer 16. A metal layer 20 is formed on the MOS device.

In FIG. 1B using rapid thermal process, the metal layer 20 reacts with the silicon of the poly-gate 12 and the source/drain region 19 to form a metal silicide layer 22 on both the poly-gate 12 and the source/drain region 19. The metal layer 20 which did not react with silicon completely is then removed by wet etching.

In the above method silicon atom of the substrate 10 is very likely to diffuse onto the spacer 16 during the rapid thermal process to form a metal silicide on the spacer 16. Therefore, a bridging effect between the substrate 10 or the source/drain region 19 and the poly-gate 12 is caused. The bridging effect leads to an unexpected electric connection to cause a short circuit.

SUMMARY OF THE INVENTION

It is an object of the invention to provide a method of fabricating a salicide layer without causing a bridging effect.

To achieve the above-mentioned objects and advantages, a method of fabricating a salicide layer. A substrate having a gate is provided. A spacer with a middle indented waistline is formed on a side wall of the gate. A metal layer is formed to cover the polysilicon gate. A thermal process is performed to form a metal silicide layer on the gate.

In the invention, the spacer is formed with a middle indented waistline. Due the middle indented topography the metal layer is formed with a gap at the indented waistline. Thus, even the silicon atoms diffuse from the substrate or from the source/drain region onto the spacer, the disconnection of the metal layer prevent a bridging effect.

Both the foregoing general description and the following detailed description are exemplary and explanatory only and are not restrictive of the invention, as claimed.

DESCRIPTION OF THE PREFERRED EMBODIMENTS

FIG. 2A to FIG. 2Fare cross sectional views showing a preferred embodiment according to the invention in which a salicide layer is formed without causing a bridging effect. In this embodiment, a gate of a MOS device is formed with a spacer having a middle indented waistline. Therefore, a metal layer for fabricating a salicide is formed without covering the middle indented waistline of the spacer, that is, the metal layer is formed with a gap at the middle indented waistline of the spacer.

Figure 1A:
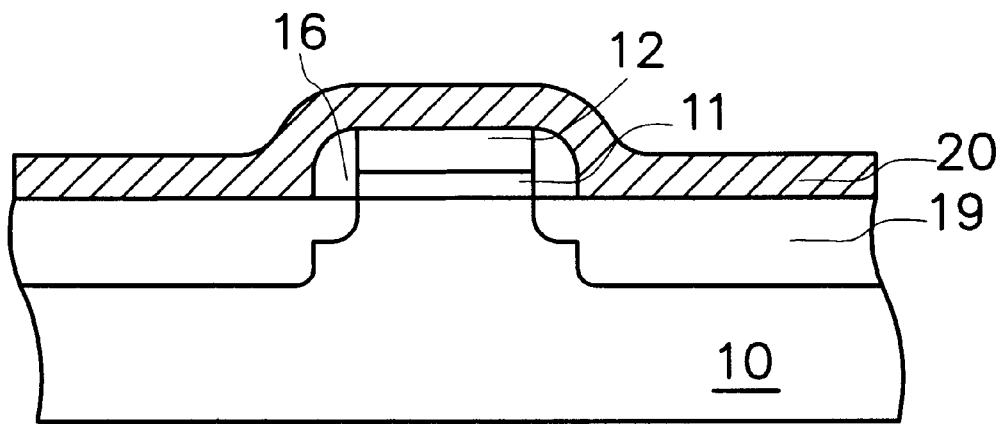
FIG. 1A and FIG. 1B are cross sectional views showing a conventional method for fabricating a salicide layer.
Figure 1B:
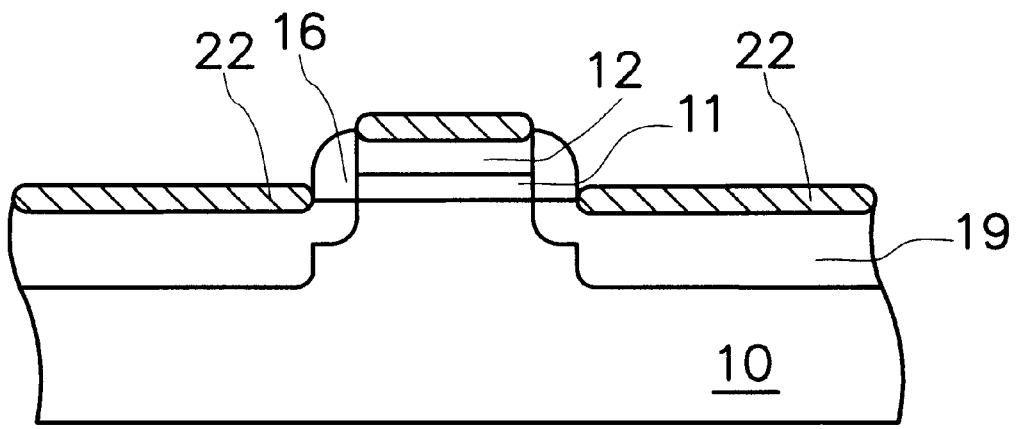
Figure 2A:
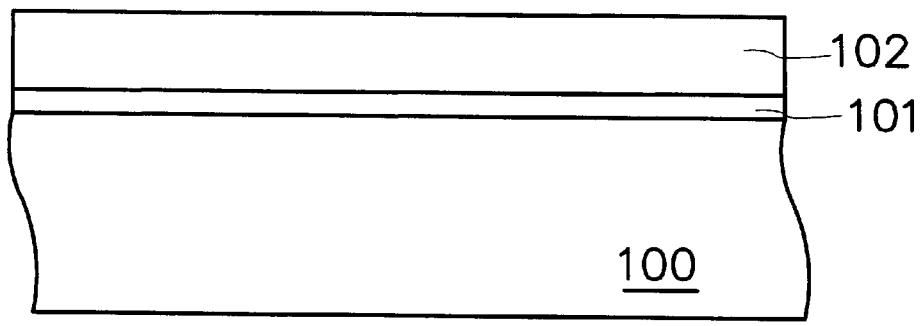
FIG. 2A to FIG. 2F are cross sectional views showing a method of fabricating a salicide layer in a preferred embodiment according to the invention.
Figure 2B:
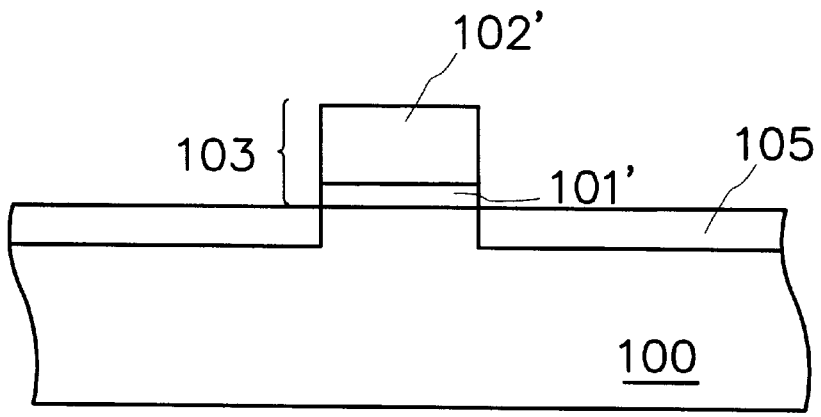
Figure 2C:
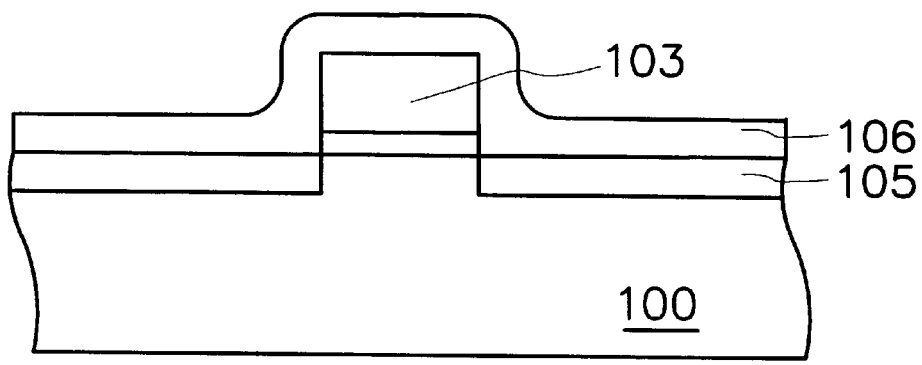

In FIG. 2A, a gate oxide layer 101 is formed on a substrate 100. A polysilicon layer 102 is formed on the gate oxide layer 101. The polysilicon layer 102 and the gate oxide layer 101 are patterned to form a gate 103 which comprises the patterned polysilicon layer 102' and the patterned gate oxide layer 101'. A lightly doping process is performed with the gate 103 as a mask to form a lightly doped region 105 as shown in FIG. 2B. In FIG. 2C, a dielectric layer 106, for example, an oxide layer having a thickness of about 1500 Å, is formed.

Figure 2D:
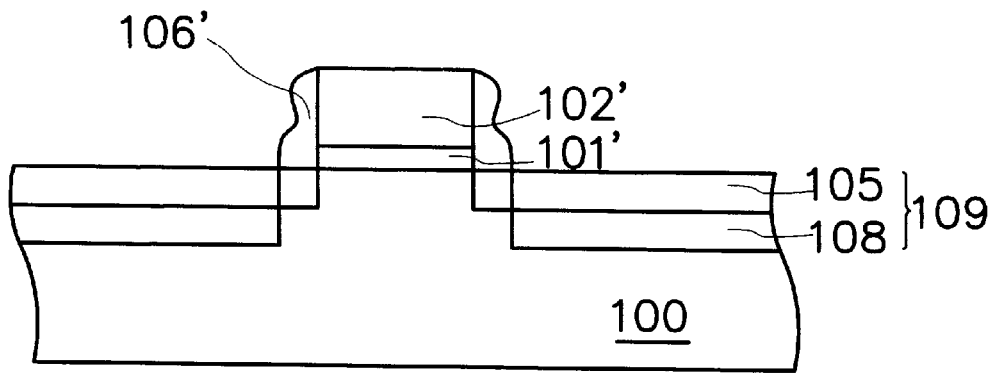

In FIG. 2D, a two-step etching process is performed to etch the dielectric layer 106. In the first etching step, an anisotropic etching process, for example, a reactive ion etch (RIE), is performed. A part of the dielectric layer 106 is removed with a thickness of about 500 to 1000 Å. A second etching step is performed, for example, by a reactive ion etching process. However, the etching parameters are altered. The concentration of the reacting gas hydrogen fluoride (HF) is increased. It is known that hydrogen fluoride reacts with other components of the etchant to form a polymer. The higher the concentration of the hydrogen fluoride is, the more polymers are produced. The polymer is formed on the insulating layer 106, so as to protect the insulating layer 106 from being etched, and thus, the polymer reduces the etching speed of the insulation layer 106. The anisotropic etching process etches the insulating layer 106 from a vertical direction with respect to the substrate 100, while the hydrogen fluoride is supplied upwardly. Therefor, more polymers are formed over an upper portion of the gate 103 more than on a lower portion of the gate 103. The upper part of the insulating layer 106 is thus etched in a lower speed compared to the lower part of the insulating layer 106. As a consequence, a spacer 106' is formed with a wider lower part and a narrower upper part. In additional to the asymmetric topography, the spacer 106' further comprises a middle indented waistline. After the formation of the spacer 106', an over etching process is performed to remove the residual insulating layer remained on the substrate 100.

Using the gate 103 and the spacer 106' as a mask, a heavily doping process is performed to the substrate 100 to form a heavily doped region 108. A source/drain region 109 with a lightly doped drain (LDD) structure (105) is thus formed.

Figure 2E:
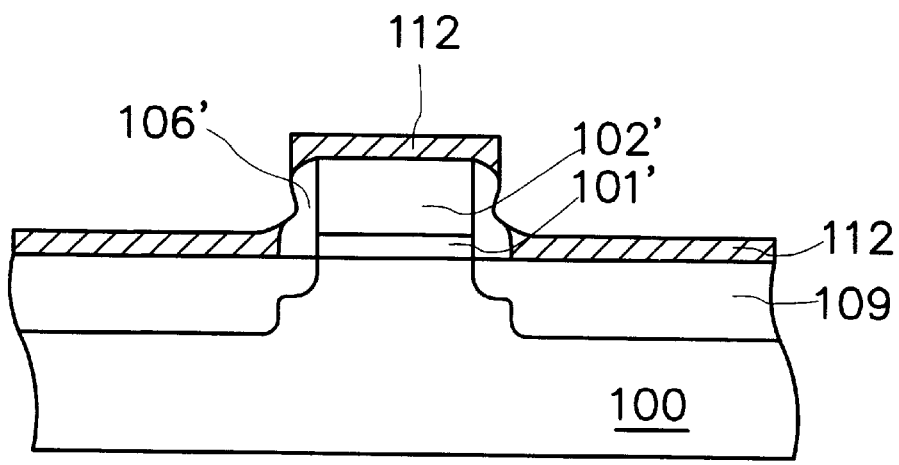

In FIG. 2E, a metal layer 112 is formed, for example, using collimator or iron metal plasma (IMP). The metal layer 112 may be formed by material such as titanium (Ti) or cobalt (Co). Due to the middle indented waistline topography, the metal layer 112 is broken. That is, a gap is formed in the metal layer 112 at the indented waistline of the spacer 106'.

Figure 2F:
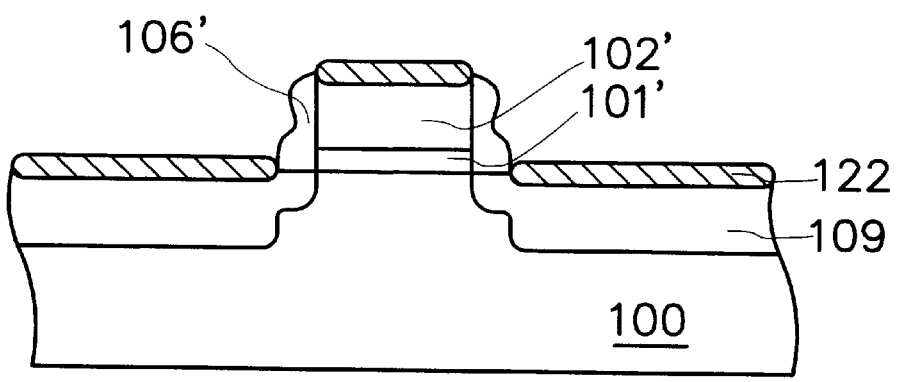

In FIG. 2F, a thermal process such as a rapid thermal process is performed to the metal layer 112. The metal layer 112 thus reacts with silicon atoms of the polysilicon layer 102 and the source/drain region 109 to form a salicide layer 122. During the thermal process, silicon atoms of substrate might diffuse upwardly to cover a part of the spacer. However, as the metal layer 112 has a gap at the indented waistline, the salicide layer is formed without bridging across the spacer 106'. Therefore, a bridging effect is not caused. After the thermal process, the unreacted metal layer is removed.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a salicide layer, comprising:

providing a substrate having a gate thereon;

forming a spacer on a side wall of the gate, the spacer having a middle indented waistline;

forming a metal layer on the gate and the substrate, the metal layer having a gap at the middle indented waistline; and transforming the metal layer into a metal silicide layer.

2. The method according to claim 1, wherein the gate further comprises a gate oxide layer on the substrate, and a polysilicon layer on the gate oxide layer.

3. The method according to claim 1, wherein the spacer includes an oxide spacer.

4. The method according to claim 1, wherein the metal layer is formed by using a collimator.

5. The method according to claim 1, wherein the metal layer is formed by using ion metal plasma.

6. The method according to claim 1, wherein the spacer is formed by the steps comprising:

forming an insulation layer over the substrate and the gate; and performing a two-step etching process to the insulating layer, wherein a second etching step uses hydrogen fluoride with a higher concentration compared to a first etching process.

7. The method according to claim 6, comprising further a step of performing an over-etch step to remove a residual insulating layer on the substrate.

8. The method according to claim 1, wherein the metal layer is transformed into a metal silicide layer by a chemical reaction between the metal layer and the gate while performing a thermal process.

9. The method according to claim 8, wherein the thermal process includes a rapid thermal process.

10. A method of fabricating a salicide layer, comprising:

providing a substrate having a gate and a source/drain region therein;

forming a spacer on a side wall of the gate, the spacer having a middle indented waistline;

forming a metal layer on the gate and the source/drain region, the metal layer having a gap at the middle indented waistline; and performing a thermal process to the metal layer.

11. The method according to claim 10, wherein the spacer includes an oxide spacer.

12. The method according to claim 10, wherein the metal layer is formed by using a collimator.

13. The method according to claim 10, wherein the metal layer is formed by using ion metal plasma.

14. The method according to claim 10, wherein the spacer is formed by the steps comprising:

forming an insulation layer over the substrate and the gate; and performing a two-step etching process to the insulating layer, wherein a second etching step uses hydrogen fluoride with a higher concentration compared to a first etching process.

15. The method according to claim 14, comprising further a step of performing an over-etch step to remove a residual insulating layer on the substrate.

16. The method according to claim 10, wherein the metal layer is transformed into a metal silicide layer by a chemical reaction between the metal layer and silicon atoms of the gate and the source/drain region while performing the thermal process.

17. The method according to claim 10, wherein the thermal process includes a rapid thermal process.

* * * * *